United States Patent
Kanno et al.

(10) Patent No.: US 6,730,239 B1
(45) Date of Patent: May 4, 2004

(54) CLEANING AGENT FOR SEMICONDUCTOR DEVICE & METHOD OF FABRICATING SEMICONDUCTOR DEVICE

(75) Inventors: Itaru Kanno, Tokyo (JP); Naoki Yokoi, Tokyo (JP); Hiroshi Morita, Tokyo (JP); Naoki Ichiki, Tsukuba (JP); Hideaki Nezu, Tokyo (JP); Masayuki Takashima, Tsukuba (JP)

(73) Assignees: Renesas Technology Corp., Tokyo (JP); Sumitomo Chemical Company, Limited, Osaka (JP)

( * ) Notice: Subject to any disclaimer, the term of this patent is extended or adjusted under 35 U.S.C. 154(b) by 103 days.

(21) Appl. No.: 09/678,793

(22) Filed: Oct. 4, 2000

(30) Foreign Application Priority Data

Oct. 6, 1999 (JP) .............................................. 11-285515

(51) Int. Cl.⁷ ........................ C09K 13/00; C09K 13/06; H01L 21/302
(52) U.S. Cl. ..................... 252/79.1; 252/79.4; 438/745; 134/1.2
(58) Field of Search ............................... 252/79.1, 79.4; 438/745; 134/1.2

(56) References Cited

U.S. PATENT DOCUMENTS

| | | | |
|---|---|---|---|
| 5,614,027 A | * 3/1997 | Dunn et al. | 134/2 |
| 5,715,173 A | * 2/1998 | Nakajima et al. | 364/500 |
| 5,814,588 A | * 9/1998 | Cala et al. | 510/175 |
| 6,007,638 A | * 12/1999 | Shinohara et al. | 134/2 |
| 6,472,357 B2 | * 10/2002 | Takashima | 510/175 |

FOREIGN PATENT DOCUMENTS

| | | | | |
|---|---|---|---|---|
| JP | 60-223120 | 11/1985 | | |
| JP | 5-271699 | 10/1993 | | |
| JP | 6-13364 | 1/1994 | | |
| JP | 10-319606 | 12/1998 | | |
| JP | 10319606 A | * 12/1998 | ......... | H01L/21/027 |
| JP | 11012594 A | * 1/1999 | ........... | C11D/1/722 |
| JP | 11-145095 | 5/1999 | | |
| JP | 2000200766 | * 7/2000 | ........... | C11D/1/722 |
| WO | WO 99/00707 | 1/1999 | | |

OTHER PUBLICATIONS

Morii et al., Liquid Cleaner Composition, Jan. 19, 1999, (English Abstract of JP 11012594 A), 2 pages.*
Sumitomo Chem Co LTd [SUMO], Cleaning liquid for removing fine organic particles . . . comprises ammonium, potassium or sodium hydroxide, oxyethylene and/or oxypropylene group and water, Jul. 18, 2000, (English Abstract of JP 2000200766 A), 2 pages.*
Kenta et al., Developer For Photoresist, Computer generated English translation JP 10319606 A, Dec. 4, 1998, 5 pages.*
Yasuo et al., Cleaning Solution for Silicon Wafer and Semiconductor Device, Computer generated English translation of JP 06013364 A, Jan. 21, 1994, 6 pages.*
Takasahi et al., Developer for Photoresist, Dec. 4, 1998, Computer translation of JP 10319606 A (in English), 5 pages.*

* cited by examiner

Primary Examiner—Nadine G. Norton
Assistant Examiner—Lynette T. Umez-Eronini
(74) Attorney, Agent, or Firm—McDermott, Will & Emery

(57) ABSTRACT

A cleaning agent for a semiconductor device contains a hydroxide, water and a compound expressed in the following general formula (I) and/or the following general formula (II):

$$HO-((EO)_x-(PO)_y)_z-H \qquad (I)$$

$$R-[(EO)_x-(PO)_y)_z-H]_m \qquad (II)$$

Thus provided is a cleaning agent for a semiconductor device, which is so improved as not to disconnect a wire or an embedded conductive layer.

8 Claims, 8 Drawing Sheets

CLEANING AGENT FOR SEMICONDUCTOR DEVICE & METHOD OF FABRICATING SEMICONDUCTOR DEVICE

BACKGROUND OF THE INVENTION

1. Field of the Invention

The present invention generally relates to a cleaning agent, and more specifically, it relates to a cleaning agent for cleaning a semiconductor substrate subjected to dry etching. The present invention also relates to a method of fabricating a semiconductor device including a step of cleaning a semiconductor substrate subjected to dry etching with such a cleaning agent.

2. Description of the Prior Art

The pattern of a semiconductor integrated circuit device is increasingly refined in order to improve the speed and the performance of the device. Not only a transistor part influencing the performance of the device but also a capacitor and a multilayer wiling step are refined In order to form a fine pattern by dry etching employing a resist film as a mask, refinement of the resist pattern and dry etching having higher anisotropy are required. Consequently, a large amount of resist residue adheres onto the fine pattern after ashing for removing the resist film employed for dry etching, and it is difficult to remove the residue with a conventional cleaning liquid.

Further, the target grain size of particles remarkably influencing the, yield of the device is also reduced following refinement of the pattern, and it is necessary to remove smaller particles.

At present, a mixed solution (hereinafter abbreviated as APM) of ammonia and aqueous hydrogen peroxide is widely employed for removing the resist residue and the particles in general. APM, which is an alkaline cleaning liquid, has an effect of finely etching a device material such as a silicon oxide and removing the resist residue and the particles. It has been reported in a learned society or the like that particles hardly adhere to a silicon substrate in an alkaline aqueous solution since the silicon substrate and the particles are negatively charged, and this phenomenon is regarded as the reason for the high cleaning effect of APM.

In a device following a design rule of not more than 0.15 $\mu$m, wires for a gate electrode, a bit line and the like are prepared from a metal material such as tungsten or a tungsten alloy having low resistance. Tungsten or an alloy such as tungsten nitride is dissolved due to reaction with aqueous hydrogen peroxide contained in APM. If such a material is exposed, therefore, APM cannot be used. When employing a mixed solution (dilute aqueous ammonia)-of ammonia and water containing no aqueous hydrogen peroxide as a cleaning liquid for preventing dissolution of the material, a silicon material such as silicon forming a semiconductor substrate or polysilicon or amorphous silicon employed as a wire material or an electrode material for a capacitor is dissolved due to reaction with ammonia although dissolution of tungsten is suppressed.

While alkaline cleaning liquids include an aqueous solution (generally used as a developer) of tetramethylammonium hydroxide (TMAH), a water-soluble organic solvent containing organic amine and the like in addition to the aforementioned aqueous ammonia, all these cleaning liquids dissolve silicon and have low cleaning ability.

Thus, there is no proper cleaning liquid removing a resist residue and particles in a state simultaneously exposing tungsten or an alloy such as tungsten nitride and silicon under the present circumstances.

Problems of a conventional method of fabricating a semiconductor device having a step simultaneously exposing tungsten and silicon are now described.

FIG. 2 is a sectional view of a semiconductor device fabricated with a conventional cleaning agent. An isolation insulator film 2 for isolating element regions from each other is provided on a major surface of a semiconductor substrate 1. A gate electrode 6 is formed by stacking a polysilicon film 4 and a tungsten (or tungsten alloy) film 5 on the semiconductor substrate 1 through a gate insulator film 3. An interlayer isolation film 7 is formed on the semiconductor substrate 1 to cover the gate electrode 6. A connection hole 7a exposing the surface of the semiconductor substrate 1 and a connection hole 7b reaching the surface of the gate electrode 6 are formed in the interlayer isolation film 7, and embedded conductive layers 8 consisting of tungsten are embedded in the connection holes 7a and 7b respectively. A bit line 9 consisting of tungsten or a tungsten alloy is provided on the interlayer isolation film 7, to be connected with the embedded conductive layers 8. Interlayer isolation films 10 and 11 are provided on the interlayer isolation film 7, to cover the bit line 9. A connection hole 12a exposing the surface of the semiconductor substrate 1 is formed through the interlayer isolation films 11, 10 and 7. An embedded conductive layer 12 consisting of tungsten is provided to cover the side wall surface and the bottom surface of the connection hole 12a. This embedded conductive layer 12, which must essentially be completely embedded in the connection hole 12a, is not completely embedded in the prior art.

An aluminum wiling layer 13 consisting of aluminum or an aluminum alloy is provided on the interlayer isolation film 11, to be connected with the embedded conductive layer 12. The conventional semiconductor device shown in FIG. 2 is fabricated through steps shown in FIGS. 3 to 15.

The problems of the method of fabricating the conventional semiconductor device shown in FIG. 2 are now described.

First Problem

Tungsten or a tungsten alloy is used as an electrode material in the conventional semiconductor device, and a gate electrode made of such a material is generally referred to as a metal gate. Tungsten silicide (WSi) was employed as a previous electrode material.

Referring to FIG. 3, the isolation insulator film 2 is formed on the semiconductor substrate 1. Then the surface of the semiconductor substrate 1 is oxidized for forming the gate insulator film 3. The polysilicon film 4 and the tungsten film 5 serving as electrode materials are successively formed on the gate insulator film 3, and a resist pattern 14 is formed thereon.

Referring to FIG. 4, the resist pattern 14 is employed as a mask for performing reactive ion etching (dry etching) on the tungsten film 5 and the polysilicon film 4, thereby forming the gate electrode 6.

Referring to FIGS. 4 and 5, the resist pattern 14 is removed by plasma treatment (referred to as ashing) with a gas containing oxygen. At this time, upwardly extending resist residues 15 adhere to the side walls of the gate electrode 6.

Referring to FIGS. 5 and 6, the resist residues 15 are removed by treatment with a cleaning agent. The cleaning agent is prepared from a mixed solution (dilute aqueous ammonia) of ammonia and water. The dilute aqueous ammonia, having small dissolubility for tungsten, dissolves polysilicon due to reaction with ammonia. Therefore, the polysilicon film 4 forming the gate electrode 6 is transversely etched to narrow the width of the gate electrode 6. Consequently, the electric characteristics of a transistor are disadvantageously deteriorated. When the cleaning agent is prepared from APM, the tungsten film 5 is remarkably dissolved although the polysilicon film 4 is not etched. Thus, APM cannot be used in practice.

While this prior art is described with reference to dry etching employing a resist mask, a similar problem arises also when employing a silicon nitride film as a mask.

Second Problem

A second problem of the method of fabricating the conventional semiconductor device having a step simultaneously exposing tungsten and silicon is now described.

Referring to FIG. 7, the gate electrode 6 is formed on the semiconductor substrate 1 and the interlayer isolation film 7 is formed thereon. A resist pattern 14 is formed on the interlayer isolation film 7.

Referring to FIG. 8, the resist pattern 14 is employed as a mask for performing reactive ion etching (dry etching) on the interlayer isolation film 7, thereby forming contact holes 16 in the interlayer isolation film 7.

Referring to FIGS. 8 and 9, the resist pattern 14 is removed by plasma treatment with a gas containing oxygen. At this time, upwardly extending resist residues 15 adhere to the side walls of the contact holes 16 as shown in FIG. 9.

Referring to FIGS. 9 and 10, the resist residues 15 are removed by treatment with a cleaning agent, which is prepared from dilute aqueous ammonia. With this cleaning agent, silicon forming the semiconductor substrate 1 is isotropically etched to form depressions 17 on the bottoms of the contact holes 16 although the cleaning agent has small dissolubility for the tungsten film 5. When such depressions 17 are formed, the embedded conductive layers 8 are not completely embedded in the contact holes 16 as shown in FIG. 2 but the bit line 9 may be disconnected from the gate electrode 6 or the semiconductor substrate 1. Even if no such disconnection takes place, resistance is disadvantageously increased. If the cleaning agent is prepared from APM, the tungsten film 5 is remarkably dissolved although the semiconductor substrate 1 is not etched. Therefore, APM cannot be used in practice.

While this prior art is described with reference to dry etching employing a resist mask, a similar problem arises also when employing a silicon nitride film as a mask.

Third Problem

A third problem of the prior art is now described.

Referring to FIG. 11, the gate electrode 6, the embedded conductive layers 8 and the bit line 9 are successively formed on the semiconductor substrate 1, and the interlayer isolation films 10 and 11 are formed thereon. A resist pattern 14 is formed on the interlayer isolation film 11.

Referring to FIG. 12, the resist pattern 14 is employed as a mask for forming a contact hole 18 by reactive ion etching (dry etching).

Referring to FIGS. 12 and 13, the resist pattern 14 is removed by plasma treatment with a gas containing oxygen. At this time, resist residues 15 vertically extending upward adheres to the side wall of the contact hole 18.

Referring to FIGS. 13 and 14, the resist residues 15 are removed by treatment with a cleaning agent.

Following higher integration and refinement of the semiconductor device, different types of insulator films are employed in a composite manner for flattening the surface of the substrate. The insulator films are formed by a thermally oxidized silicon film, a silicon oxide film prepared by CVD, a BPSG film containing B, P etc. and the like.

In this example, the interlayer isolation films 7, 10 and 11 are made of different materials. For example, the interlayer isolation film 7 is made of TEOS, the interlayer isolation film 10 is made of BPSG, and the interlayer isolation film 11 is made of TEOS. In formation of the contact hole 18, APM is employed as the cleaning agent since no tungsten is exposed in this portion. The quantity of dissolution (quantity of etching) with APM having dissolubility for a silicon oxide film varies with the type of the silicon oxide film. APM has a larger quantity of etching for the BPSG film forming the interlayer isolation film 10 as compared with the TEOS films forming the interlayer isolation films 7 and 11. Therefore, the interlayer isolation film 10 is transversely etched on the wall surface of the contact hole 18 as shown in FIG. 14, to irregularize the side wall surface of the contact hole 18.

Referring to FIGS. 14 and 15, a tungsten film is formed by CVD in this state for forming the embedded conductive layer 12 consisting of tungsten in the contact hole 18 by dry etching or chemical mechanical polishing (CMP). At this time, the contact hole 18 is not completely filled up with tungsten but defines a cavity as shown in FIG. 15, to result in disconnection in an intermediate stage as the case maybe.

Consequently, the aluminum wiling layer 13 formed on the contact hole 18 as shown in FIG. 2 may not be connected with the semiconductor substrate 1. Even if no such disconnection takes place, the resistance between the aluminum wiling layer 13 and the semiconductor substrate 1 is disadvantageously increased.

When cleaned with APM, the diameter of the contact hole 18 is increased to cause short-circuiting with a wire or the like arranged beside the contact hole 18 as the case may be.

In addition to APM, dilute aqueous ammonia also has an effect of removing resist residues. However, dilute aqueous ammonia cannot be applied since the same etches the semiconductor substrate 1.

While the prior art is described with reference to contact with the semiconductor substrate 1, similar problems arise also with reference to contact with another element such as the gate electrode 6 or the bit line 9.

As hereinabove described, the conventional cleaning agent and the conventional method of fabricating a semiconductor device have the problems of dissolving tungsten, an alloy such as tungsten nitride or silicon and causing difference between quantities of etching of different types of oxide films, to consequently deteriorate the characteristics of the semiconductor device by disconnecting the wire and the embedded conductive layer and increasing the resistance.

SUMMARY OF THE INVENTION

Accordingly, an object of the present invention is to provide a cleaning agent for a semiconductor device, which is so improved as not to disconnect a wire and an embedded conductive layer.

Another object of the present invention is to provide a cleaning agent for a semiconductor device, which is so improved as not to increase the resistance of a wire or an embedded layer.

Still another object of the present invention is to provide a method of fabricating a semiconductor device, which is so improved as not to disconnect a wire or an embedded layer.

A further object of the present invention is to provide a method of fabricating a semiconductor device, which is so improved as not to increase the resistance of a wire or an embedded layer.

A cleaning agent for a semiconductor device according to a first aspect of the present invention contains a hydroxide, water and a compound expressed in the following general formula (I) and/or the following general formula (II):

$$HO-((EO)_x-(PO)_y)_z-H \quad (I)$$

where EO represents an oxyethylene group; PO represents an oxypropylene group, x and y represent integers satisfying $x/(x+y)=0.05$ to $0.4$, and z represents a positive integer.

$$R-[(EO)_x-(PO)_y)_z-H]_m \quad (II)$$

where EO, PO, x, y and z are defined identically to those in the general formula (I), R represents a residue of alcohol or amine excluding a hydroxyl group or a hydrogen atom of an amino group, and m represents an integer of at least 1.

The oxyethylene group is expressed as $-CH_2-CH_2-O-$, and the oxypropylene group is expressed as $-CH(CH_3)-CH_2-O-$ or as $-CH_2-CH(CH_3)-O-$.

Dissolubility in preparation of the cleaning agent is insufficient if the value of $x/(x+y)$ is less than 0.05, while defoamability of the cleaning agent is insufficient if the value is greater than 0.4.

The part expressed as $(EO)_x-(PO)_y)_z$ in each of the general formulas (I) and (II) may be a block copolymer, a random copolymer or a blocky random copolymer, and the block copolymer is preferable among these.

Alcohol forming the aforementioned R is prepared from monohydric alcohol such as 2-ethylhexyl alcohol, lauryl alcohol, cetyl alcohol, oleyl alcohol, stearyl alcohol, tridecyl alcohol, tallow alcohol or coconut oil alcohol or polyhydric alcohol such as ethylene glycol, propylene glycol, 1,3-propanediol, 1,2-butanediol, 1,3-butanediol, 2,3-butanediol, 1,4-butanediol, 2-methyl-1,2-propanediol, 2-methyl-1,3-propanediol, glycerin, trimethylol ethane, trimethylol propane, pentaerythritol or sorbitol, and amine is prepared from methylene diamine or propylene diamine.

The cleaning agent according to the first aspect of the present invention hardly dissolves tungsten or an alloy such as tungsten nitride, silicon and an insulator film, and exhibits the same quantity of etching for different types of insulator films. Consequently, the cleaning agent attains such an effect that the width of a gate electrode is not narrowed.

Preferably, the aforementioned hydroxide is ammonium hydroxide.

In this case, the amount of impurities contained in a solution is so small that no impurities remain on the surface of a semiconductor substrate since ammonium hydroxide is employed as the hydroxide. Preferably, the aforementioned hydroxide is selected from a group consisting of tetramethylammonium hydroxide, a hydroxide of potassium and a hydroxide of sodium.

The concentration of the hydroxide contained in the aforementioned cleaning agent is preferably 0.01 to 31 percent by weight, and more preferably 0.1 to 3 percent by weight. A sufficient cleaning effect cannot be attained if the concentration of the hydroxide is excessively low, while the quantity of etching for silicon is increased if the concentration of the hydroxide is excessively high. Therefore, the concentration of the hydroxide is preferably in the range of 0.01 percent by weight to 31 percent by weight.

Preferably, the mean molecular weight of the total of the oxypropylene group in the compound expressed in the general formula (I) and/or (II) is 500 to 5000.

The cleaning effect is insufficient if the mean molecular weight is too small, while dissolubility in preparation is insufficient if the mean molecular weight is too large.

Preferably, the weight ratio of the compound expressed in the general formula (I) and/or (II) to the hydroxide is $(0.3 \times 10^{-4}$ to $1):1$.

The quantity of etching for silicon is increased if the ratio of the copolymer is too small, while defoamability is insufficient if the ratio of the copolymer is too large.

Preferably, the pH of the aforementioned cleaning agent is rendered at least 8.

Preferably, the cleaning agent further contains not more than 1 percent by weight of hydrogen peroxide.

The quantity of etching for tungsten, which is increased if the content of hydrogen peroxide is large, can be reduced to a proper level if the content of hydrogen peroxide is not more than 1 percent by weight, while the quantity of etching for silicon can be further reduced due to mixing with hydrogen peroxide.

A method of fabricating a semiconductor device according to a second aspect of the present invention comprises a first step of preparing a semiconductor substrate completely subjected to dry etching and a second step of cleaning the surface of the semiconductor substrate with a cleaning agent containing a hydroxide, water and a compound expressed in the following general formula a) and/or the following general formula (II):

$$HO-((EO)_x-(PO)_y)_z-H \quad (I)$$

where EO represents an oxyethylene group, PO represents an oxypropylene group, x and y represent integers satisfying $x/(x+y)$ 0.05 to 0.4, and z represents a positive integer.

$$R-[(EO)_x-(PO)_y)_z-H]_m \quad (II)$$

where EO, PO, x, y and z are defined identically to those in the general formula (I), R represents a residue of alcohol or amine excluding a hydroxyl group or a hydrogen atom of an amino group, and m represents an integer of at least 1.

The conventional cleaning agent has such a problem that a polysilicon film forming a gate electrode is transversely etched to narrow the width of the gate electrode and deteriorate the electrical characteristics of a transistor. When employing the aforementioned cleaning agent, however, the width of the gate electrode is not narrowed since the polysilicon film is not etched.

Preferably, the aforementioned first step includes steps of performing the aforementioned dry etching with a resist pattern and removing the resist pattern by ashing.

In this case, a resist residue adhering onto a fine pattern can be efficiently removed.

Preferably, the aforementioned first step includes a step of exposing a metal film containing tungsten and/or a silicon material on the aforementioned semiconductor substrate by the aforementioned dry etching.

In this case, a resist residue and particles can be efficiently removed in such a state that tungsten or an alloy such as tungsten nitride and silicon are simultaneously exposed.

Preferably, the aforementioned first step includes steps of forming a wiring pattern containing polysilicon and tungsten on the aforementioned semiconductor substrate by the aforementioned dry etching employing a resist pattern and removing the resist pattern.

In this case, a polysilicon film forming a gate electrode is not transversely etched. Thus, the width of the gate electrode is not narrowed.

Preferably, the aforementioned first step includes steps of forming a wiling pattern containing tungsten on the aforementioned semiconductor substrate, forming an insulator film on the wiling pattern, forming a connection hole in the insulator film by the aforementioned dry etching employing a resist pattern, and removing the resist pattern.

In this case, no depression is formed on the bottom of the connection hole. Thus, an embedded conductive layer is completely embedded in the connection hole.

Preferably, the aforementioned first step includes steps of forming at least two types of silicon oxide insulator films on the aforementioned semiconductor substrate and performing the aforementioned dry etching on the two types of silicon oxide insulator films.

In this case, the side wall surface of a contact hole is not irregularized. Thus, tungsten or the like is completely embedded in the contact hole.

Preferably, the aforementioned cleaning is performed by setting the liquid temperature of the aforementioned cleaning agent to 20° C. to 50° C. and dipping the aforementioned semiconductor substrate in the cleaning agent.

Removability for a resist residue is reduced if the liquid temperature is not more than 20° C., while dissolubility for silicon or an insulator film is increased if the liquid temperature is in excess of 65° C. Therefore, the liquid temperature of the aforementioned cleaning agent to 20° C. to 65° C., for dipping the semiconductor substrate.

Preferably, the aforementioned cleaning is performed by setting the liquid temperature of the aforementioned cleaning agent to 20° C. to 65° C. and spraying the cleaning agent to the semiconductor substrate.

Removability for a resist residue is reduced if the liquid temperature is not more than 20° C., while dissolubility for silicon or an insulator film is increased if the liquid temperature is in excess of 65° C. Therefore, the cleaning is desirably performed by spraying at the liquid temperature in the range of 20° C. to 65° C.

Preferably, the aforementioned cleaning is performed by introducing ultrasonic waves into the aforementioned semiconductor substrate.

If the cleaning is performed for removing particles or the like, the cleaning effect is further improved by employing physical cleaning with ultrasonic waves or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
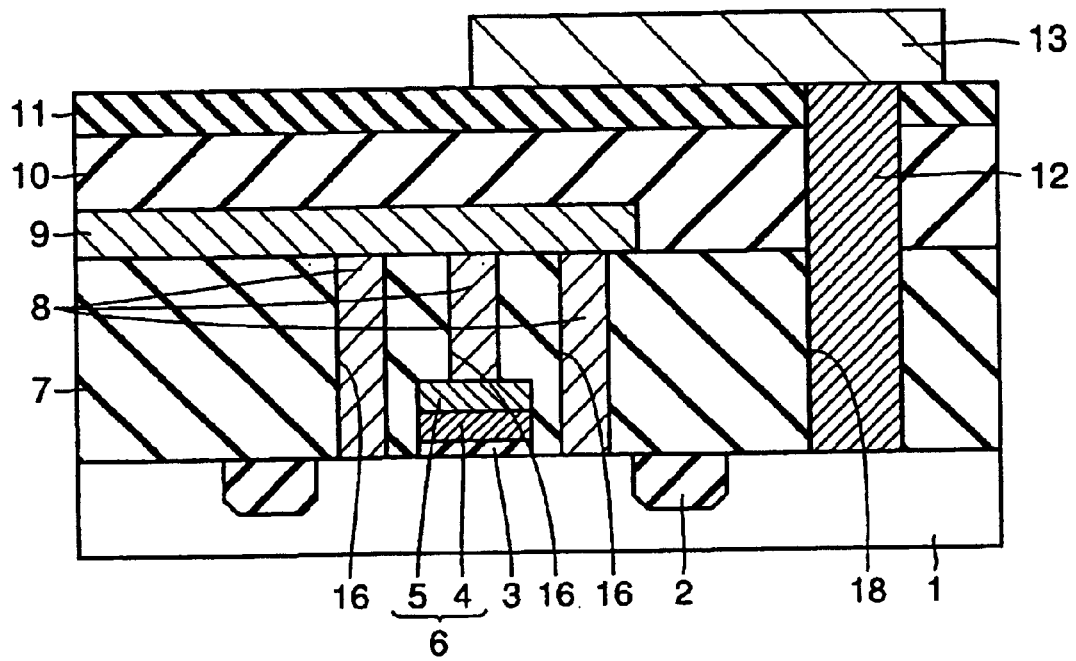
FIG. 1 is a sectional view of a semiconductor device fabricated with a cleaning agent according to an embodiment of the present invention.

An embodiment of the present invention is now described with reference to the drawing.

Figure 2:
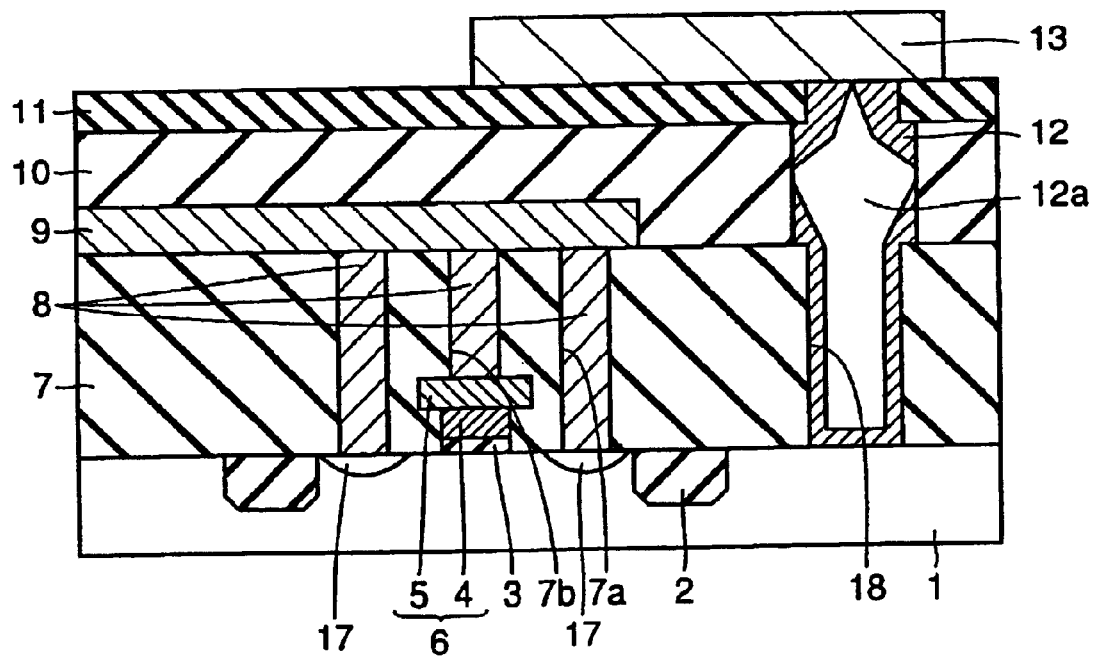
FIG. 2 is a sectional view of a semiconductor device formed by a conventional fabrication method.

FIG. 1 is a sectional view of a semiconductor device fabricated with a cleaning agent according to the embodiment of the present invention. The semiconductor device shown in FIG. 1 is identical to that shown in FIG. 2 fabricated by the conventional method except the points described below. Therefore, parts identical or corresponding to those in FIG. 1 are denoted by the same reference numerals and redundant description is not repeated.

The inventive semiconductor device shown in FIG. 1 is different from the prior art in the point that a polysilicon film 4 is not etched and hence the width of a gate electrode 6 is not narrowed.

Further, no depressions are: defined by etching on the bottoms of contact holes 8.

In addition, the side wall of a contact hole 12 is not irregularized but an embedded conductive layer 12 is completely embedded in the contact hole 12.

While Examples of the present invention are now described, the present invention is not restricted to these Examples.

EXAMPLES 1, 2 AND 3 AND COMPARATIVE EXAMPLE 1

A test piece for each of cleaning agents of Examples 1, 2 and 3 and comparative example 1 was formed as an object of cleaning by a sample prepared by forming a silicon dioxide film of 1000 Å on a silicon substrate, and thereafter forming a polysilicon film of 2800 Å in thickness. The test pieces were dipped in the cleaning agents shown in Table 1, which were held at 45° C. in thermostatic baths for measuring the thicknesses of the polysilicon films before and after dipping, thereby examining the etching rates of the cleaning agents for polysilicon. Table 1 shows the results.

TABLE 1

| | Composition of Cleaning Liquid | Etching Rate |
| --- | --- | --- |
| Example 1 | ammonium hydroxide: 0.3 wt. % Adeca L31*: 2.5 ppm | 3.0 Å/min |
| Example 2 | ammonium hydroxide: 0.3 wt. % Adeca TR702**: 2.5 ppm | 1.0 Å/min |
| Example 3 | ammonium hydroxide: 0.3 wt. % NFB2040***: 2.5 ppm | 2.0 Å/min |
| Comparative Example 1 | ammonium hydroxide: 0.3 wt. % | 35 Å/min |

*Adeca L31 (by Asahi Denka Kogyo K.K.): a compound expressed in the general formula (I) with x/(x + y) of 0.1 and a mean molecular weight of 950 of the total of the oxypropylene group
**Adeca TR702 (by Asahi Denka Kogyo K.K.): a compound expressed in the general formula (II) with x/(x + y) of 0.2, a mean molecular weight of 2500 to 3000 of the total of the oxypropylene group and R of ethylene diamine
***NFB2040 (by Aoki Oils and Fats Kogyo K.K.): a compound expressed in the general formula (II) with x/(x + y) of 0.35, a mean molecular weight of 850 of the total of the oxypropylene group and R of ethylhexyl alcohol The thicknesses of the polysilicon films were measured with Nanospeck AFT by Nanometrix Co., Ltd.

It was possible to suppress etching of the polysilicon films by employing the cleaning agents having the compositions of Examples 1, 2 and 3.

EXAMPLE 4

Example 4 of the present invention is described with reference to exemplary application of the inventive cleaning agent in the process of forming a gate electrode.

Figure 3:
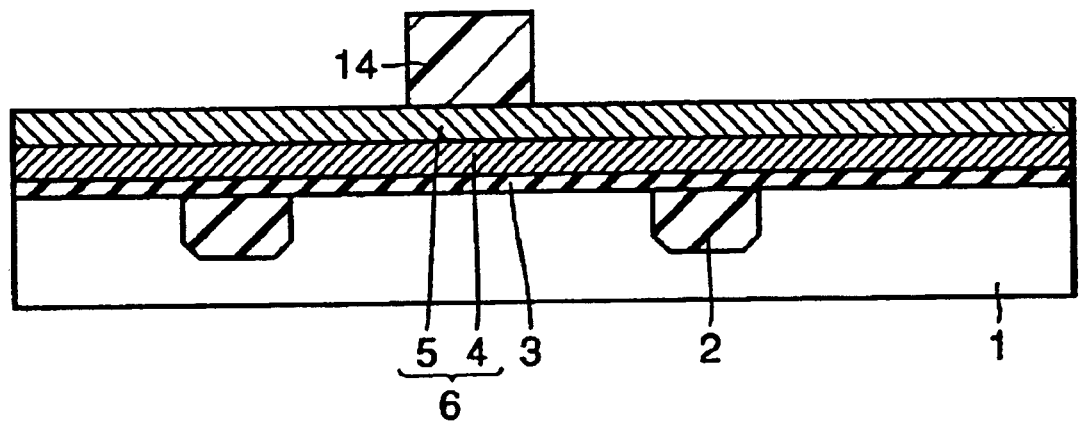
FIGS. 3 to 15 are sectional views showing first to thirteenth steps of a conventional method of fabricating a semiconductor device.
Figure 4:
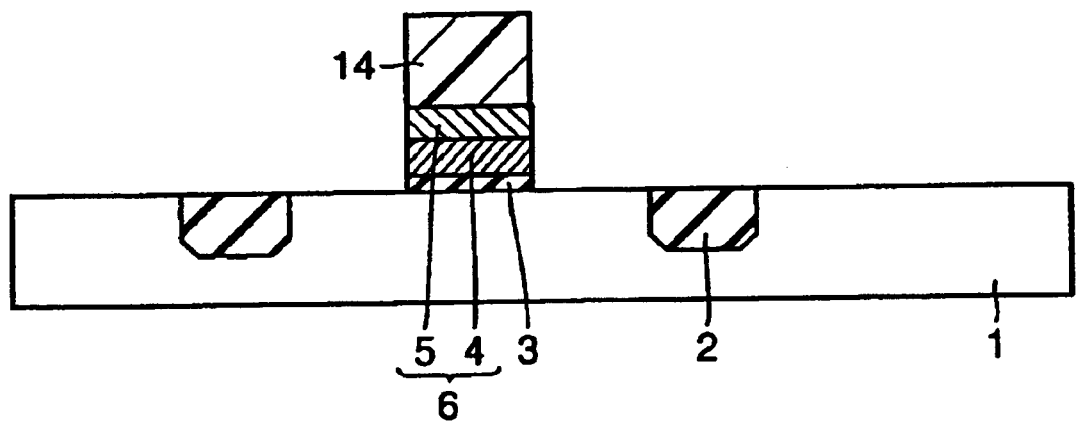
Figure 5:
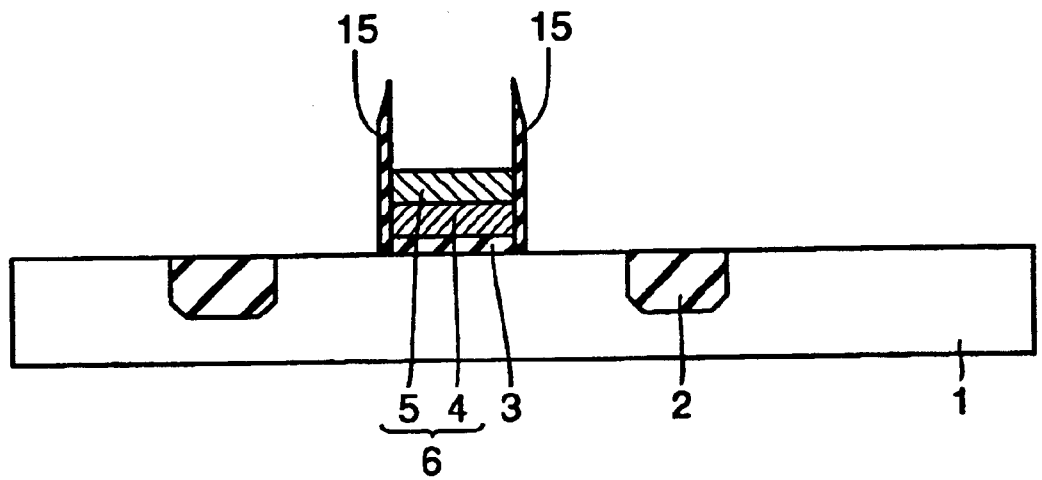
Figure 6:
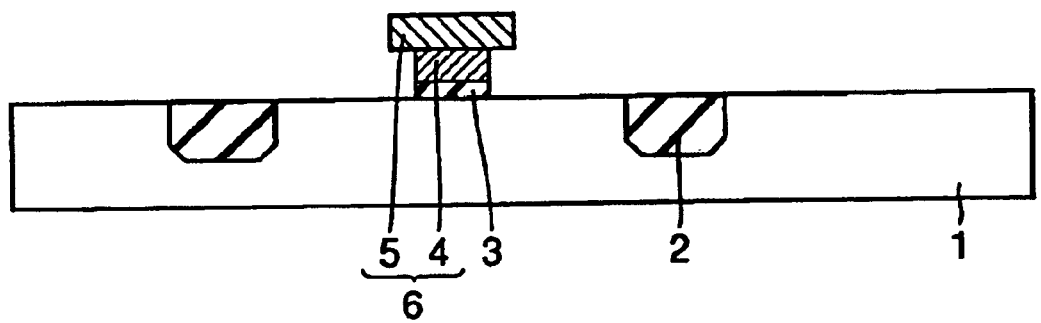

First, steps similar to those shown in FIGS. 3 and 4 are carried out. Referring to FIGS. 5 and 6, the resist residues 15 adhering to the upper and side surfaces of the gate electrode 6 are removed with the cleaning agent according to the present invention. The inventive cleaning agent hardly has dissolubility for tungsten or an alloy such as tungsten nitride, silicon and an insulator film, and has the same etching rate for different types of insulator films. The conventional cleaning agent has the problem that the polysilicon film 4 forming the gate electrode 6 is transversely etched to narrow the width of the gate electrode 6 and deteriorate the electric characteristics of the transistor. When the inventive cleaning agent is employed, the polysilicon film 4 is not etched and hence the width of the gate electrode 6 is not narrowed as shown in FIG. 1.

The hydroxide contained in the inventive cleaning agent is any of ammonium hydroxide, tetramethylammonium hydroxide, a hydroxide of potassium and a hydroxide of sodium. In consideration of impurities contained in the solution, ammonium hydroxide attaining satisfactory results in semiconductor application is most suitable.

EXAMPLE 5

Example 5 of the present invention is described with reference to formation of a contact hole for connection with a gate electrode and a contact hole for connection with a semiconductor substrate.

Figure 7:
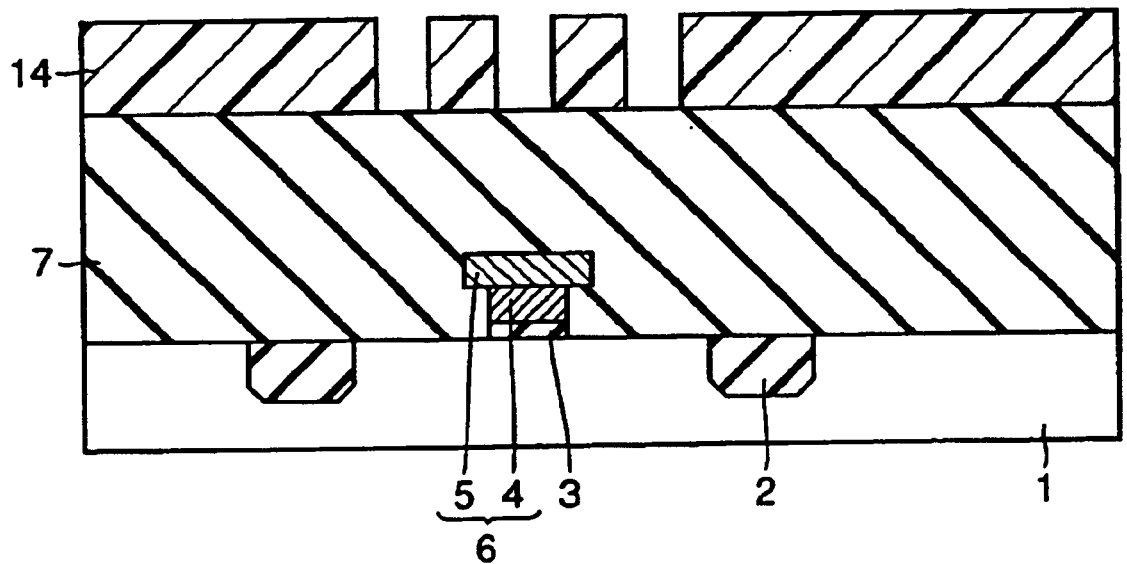
Figure 8:
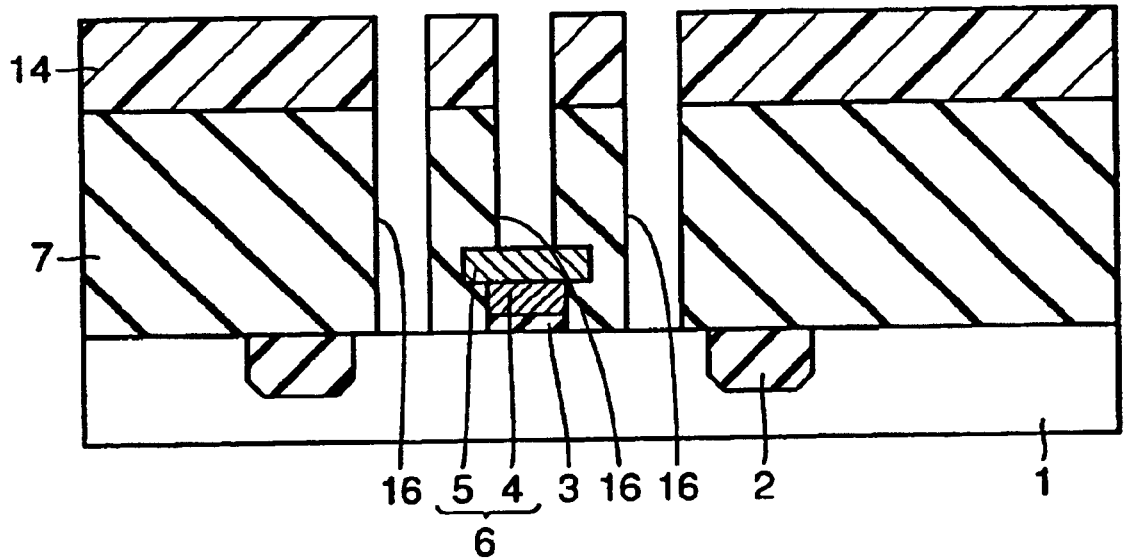

First, steps similar to those of the prior art shown in FIGS. 7 and 8 are carried out.

Figure 9:
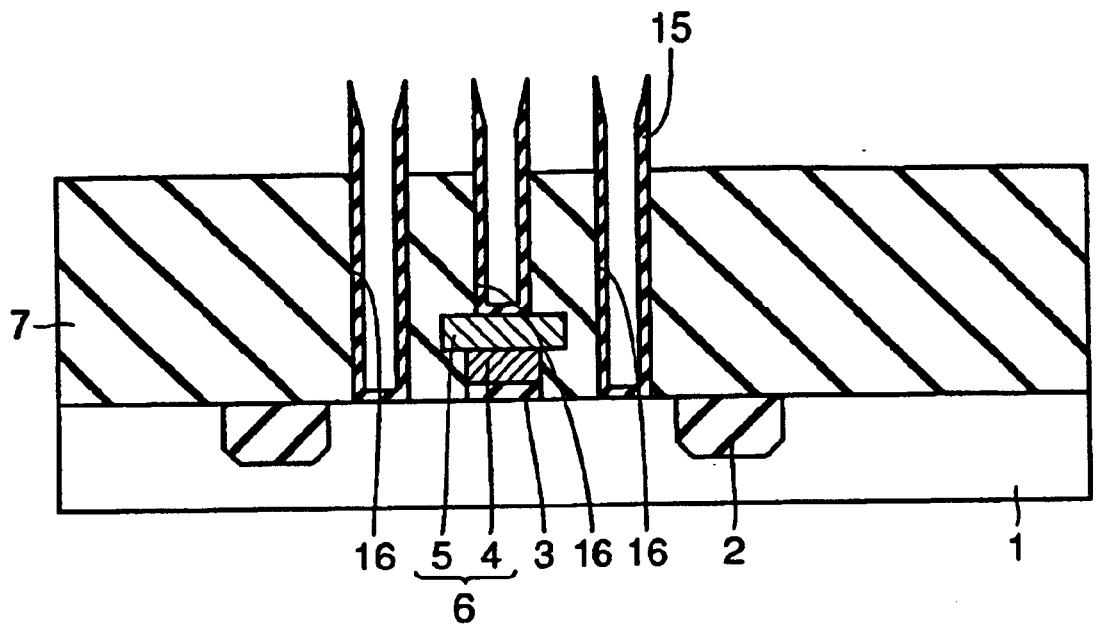
Figure 10:
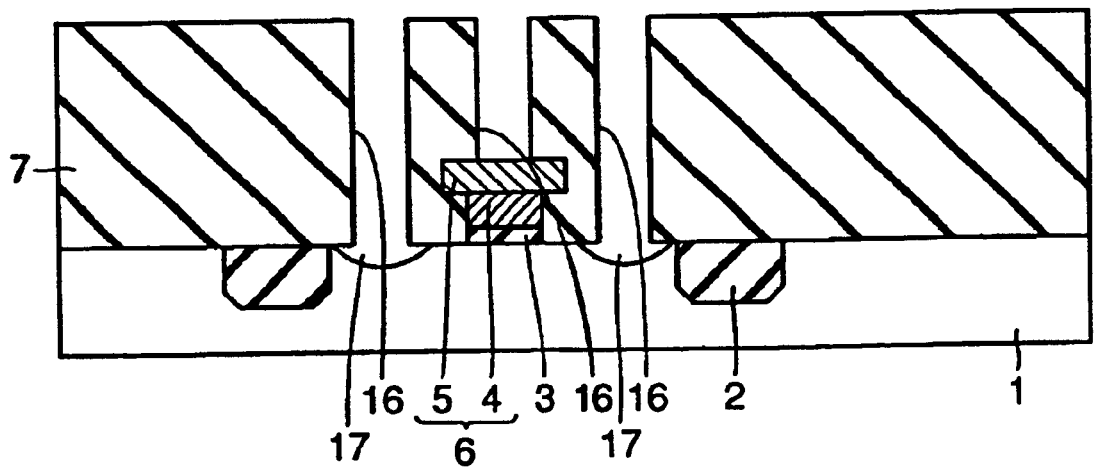

In the state shown in FIG. 9, the resist residues 15 adhering to the side surfaces of the contact holes 16 are removed with any of the inventive cleaning agents described with reference to Example 1. The inventive cleaning agent, hardly having dissolubility for tungsten or an alloy such as tungsten nitride and silicon, causes no depressions 17 shown in FIG. 10, which are caused in the conventional cleaning agent by etching the semiconductor substrate 1. Consequently, the bit line 9 is normally connected with the gate electrode 6 and the semiconductor substrate 1 through the embedded conductive layers 8 as shown in FIG. 1, so that stable electric characteristics can be obtained.

EXAMPLE 6

Example 6 of the present-invention relates to formation of a contact hole for connection with a semiconductor substrate.

Figure 11:
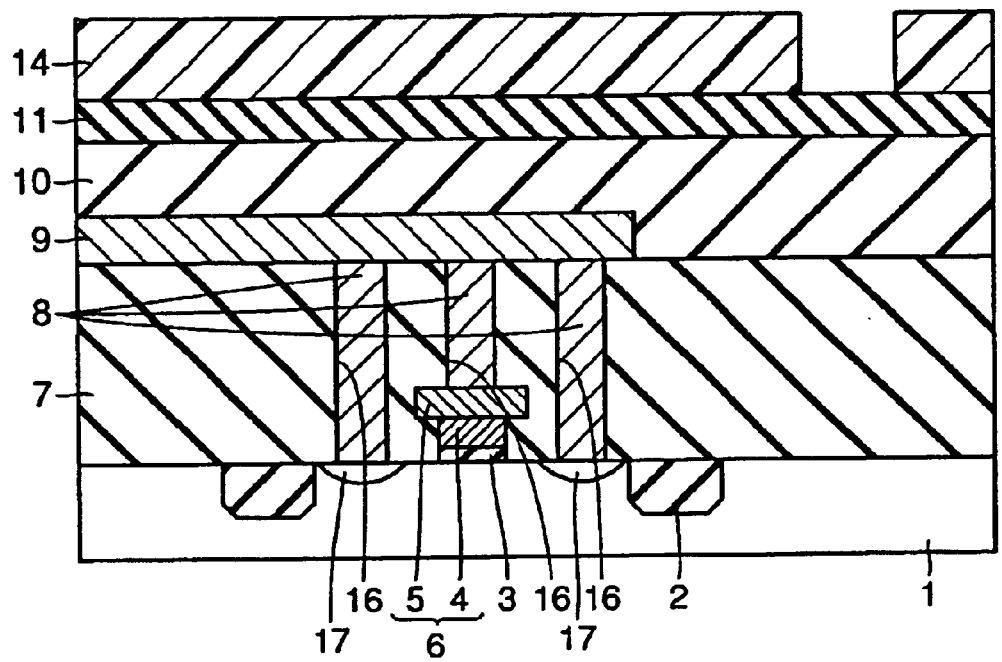
Figure 12:
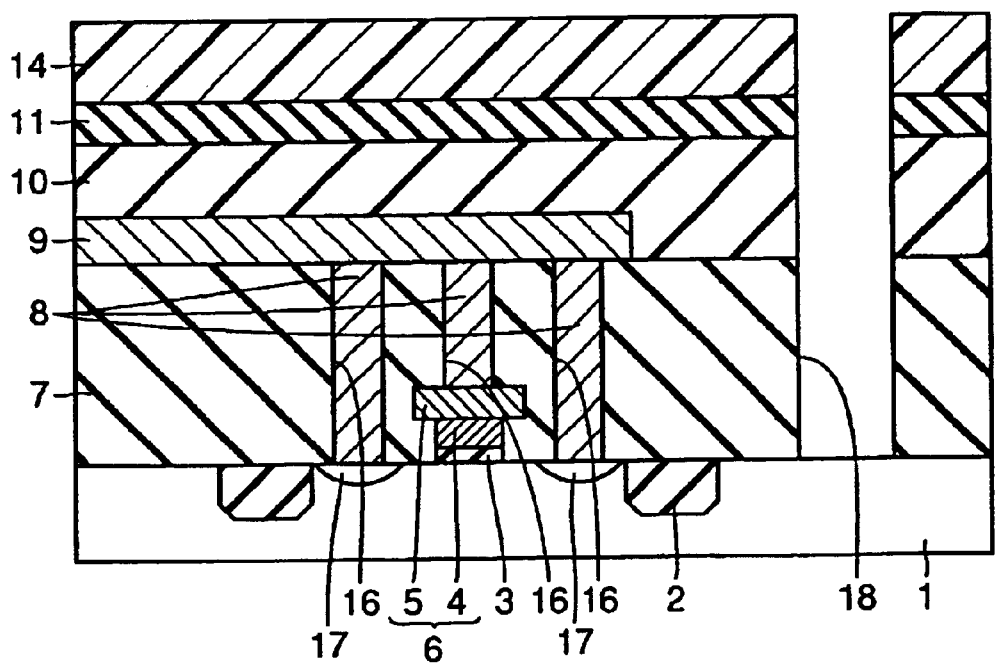

First, steps similar to those of the prior art shown in FIGS. 11 and 12 are carried out.

Figure 13:
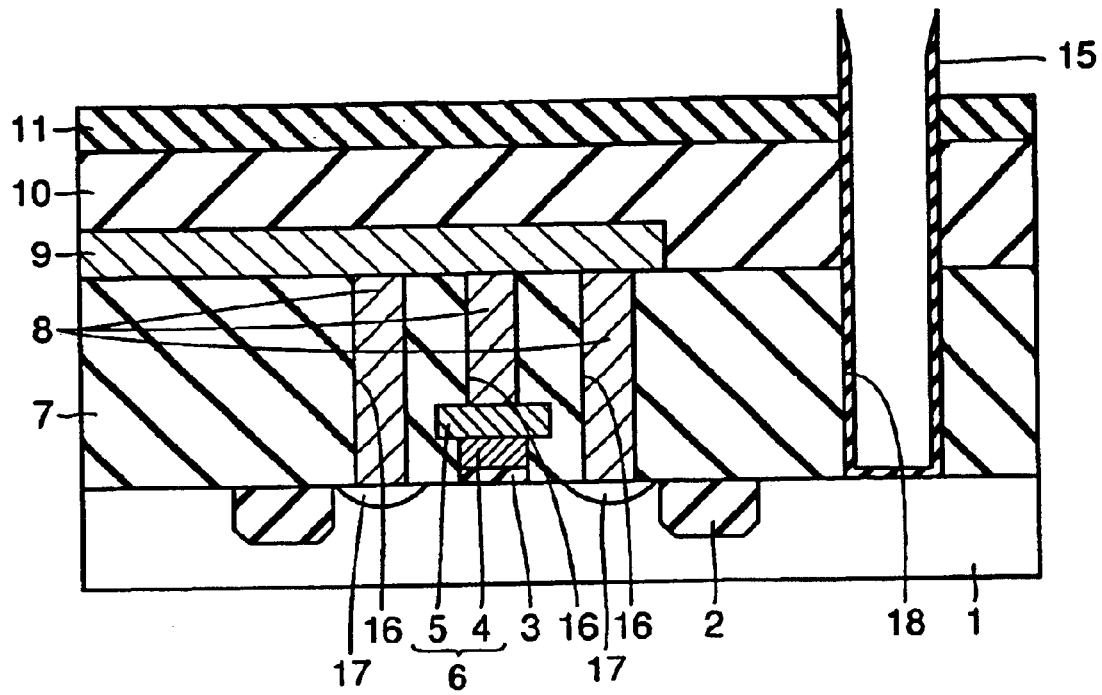
Figure 14:
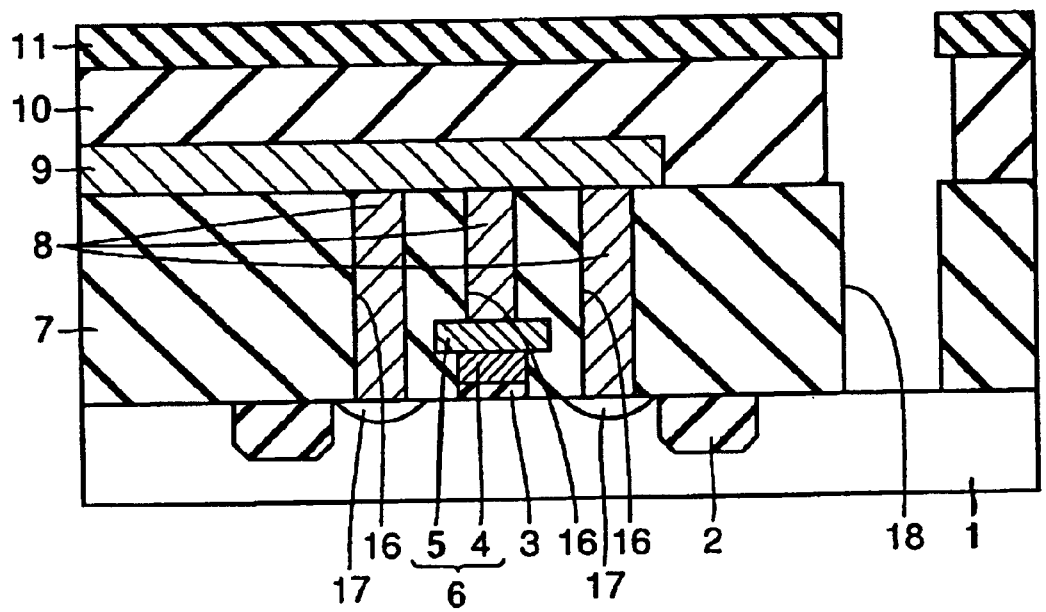
Figure 15:
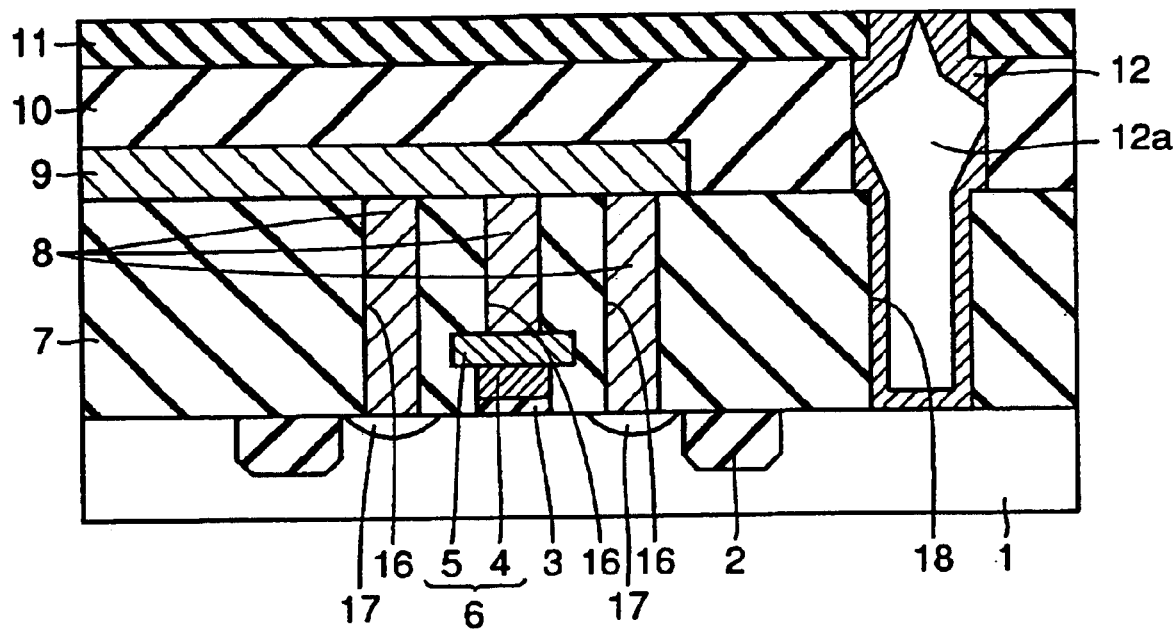

In the state shown in FIG. 13, the resist residues 15 adhering to the upper and side surfaces of the contact hole 18 are removed with the inventive cleaning agent described with reference to Example 1. The inventive cleaning agent, hardly having dissolubility for silicon and an insulator film, causes no irregularity shown in FIG. 14 caused in the conventional cleaning agent by etching the interlayer isolation film 10. Consequently, the aluminum wiring layer 13 is normally connected with the semiconductor substrate 1 through the embedded conductive layer, 12 as shown in FIG. 1, so that stable electric characteristics can be obtained.

While the conventional cleaning agent entirely enlarges the diameter of the contact hole 18 to short-circuit a wire arranged beside the contact hole 18 or the like as the case may be, such entire enlargement of the diameter of the contact hole 18 is suppressed in the case of the inventive cleaning agent having a small quantity of etching for an insulator film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cleaning agent for a semiconductor device containing a hydroxide, water and a compound expressed in the following general formula (I) and/or the following general formula (II):

$$HO-((EO)_x-(PO)_y)_z-H \qquad (I)$$

where EO represents an oxyethylene group, PO represents an oxypropylene group, x and y represent integers satisfying x/(x+y)=0.05 to 0.4, and z represents a positive integer.

$$R-[(EO)_x-(PO)_y_z-H]_m \qquad (II)$$

where EO, PO, x, y and z are defined identically to EO, PO, x, y and z in the general formula (I), R represents a residue of alcohol or amine excluding a hydroxyl group or a hydrogen atom of an amino group, and m represents an integer of at least 1.

2. The cleaning agent for a semiconductor device in accordance with claim 1, wherein said hydroxide includes ammonium hydroxide.

3. The cleaning agent for a semiconductor device in accordance with claim 1, wherein said hydroxide is selected from a group consisting of tetramethylammonium hydroxide, a hydroxide of potassium and a hydroxide of sodium.

4. The cleaning agent for a semiconductor device in accordance with claim 1, wherein the concentration of said hydroxide contained in said; cleaning agent is 0.01 percent by weight to 31 percent by weight.

5. The cleaning agent for a semiconductor device in accordance with claim 1, wherein the mean molecular weight of the total of said oxypropylene group in said compound expressed in the general formula (I) or (II) is 500 to 5000.

6. The cleaning agent for a semiconductor device in accordance with claim 1, wherein the weight ratio of said compound expressed in the general formula (I) and/or the general formula (II) to said hydroxide is $(0.3 \times 10^{-4}$ to $1):1$.

7. The cleaning agent for a semiconductor device in accordance with claim 1, wherein the pH of said cleaning agent is at least 8.

8. The cleaning agent for a semiconductor device in accordance with claim 1, further containing not more than 1 percent by weight of hydrogen peroxide.

* * * * *